United States Patent
Yoo et al.

(10) Patent No.: US 11,830,814 B2
(45) Date of Patent: Nov. 28, 2023

(54) WIRING MATERIAL FOR SEMICONDUCTOR DEVICE, WIRING FOR SEMICONDUCTOR DEVICE INCLUDING THE SAME, AND SEMICONDUCTOR DEVICE INCLUDING THE WIRING

(71) Applicant: Samsung Electronics Co., Ltd., Suwon-si (KR)

(72) Inventors: Joungeun Yoo, Seongnam-si (KR); Youngjae Kang, Suwon-si (KR); Duseop Yoon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/376,624

(22) Filed: Jul. 15, 2021

(65) Prior Publication Data

US 2022/0068824 A1   Mar. 3, 2022

(30) Foreign Application Priority Data

Aug. 31, 2020   (KR) .................. 10-2020-0110591

(51) Int. Cl.
*H01L 23/532* (2006.01)
*C22C 29/14* (2006.01)

(52) U.S. Cl.
CPC ........ *H01L 23/53209* (2013.01); *C22C 29/14* (2013.01); *H01L 23/53257* (2013.01); *B22F 2302/35* (2013.01)

(58) Field of Classification Search
None
See application file for complete search history.

(56) References Cited

U.S. PATENT DOCUMENTS

| | | | |
|---|---|---|---|
| 6,627,118 B2 | 9/2003 | Kageyama et al. | |
| 6,797,341 B2 | 9/2004 | Zeng et al. | |
| 6,831,004 B2 | 12/2004 | Byun et al. | |
| 7,238,970 B2 | 7/2007 | Hirose et al. | |
| 2002/0003227 A1 | 1/2002 | Kageyama et al. | |
| 2005/0095763 A1 | 5/2005 | Samavedam et al. | |
| 2008/0017279 A1* | 1/2008 | Venkataramani | H10N 60/202 148/400 |
| 2016/0027896 A1 | 1/2016 | Lee et al. | |
| 2019/0099806 A1* | 4/2019 | Bocchini | B33Y 10/00 |
| 2020/0013715 A1 | 1/2020 | Park et al. | |
| 2020/0091426 A1 | 3/2020 | Yao et al. | |

OTHER PUBLICATIONS

Extended European Search Report dated Feb. 1, 2022 for corresponding European Application No. 21193431.0.
Daniel Gall, "Metals for low-resistivity interconnects" IEEE (2018) 157-159.

(Continued)

*Primary Examiner* — Katie L. Hammer
(74) *Attorney, Agent, or Firm* — Harness, Dickey & Pierce, P.L.C.

(57) ABSTRACT

Provided are a wiring material for a semiconductor device, the wiring material including a boride-based compound containing boron and at least one metal selected from elements of Groups 2 to 14, a wiring for a semiconductor device including the same, and a semiconductor device including the wiring containing the wiring material.

28 Claims, 3 Drawing Sheets

(56) References Cited

OTHER PUBLICATIONS

Georg Kresse et al. "Vienna Ab-initio Simulation Package" (2009).
Joung Eun Yoo et al., "A Prospective Material, Max Phase, For Overcoming Scaling Limitations In The Resistivity Of Metal Thin Film" Samsung Best Paper Award 2020.
Daniel Gall, "Electron Mean Free Path in Elemental Metals" J. Appl. Phys. 119, 085101 (2016).

* cited by examiner

WIRING MATERIAL FOR SEMICONDUCTOR DEVICE, WIRING FOR SEMICONDUCTOR DEVICE INCLUDING THE SAME, AND SEMICONDUCTOR DEVICE INCLUDING THE WIRING

CROSS-REFERENCE TO RELATED APPLICATION

This application is based on and claims priority under 35 U.S.C. § 119 to Korean Patent Application No. 10-2020-0110591, filed on Aug. 31, 2020 in the Korean Intellectual Property Office, the disclosure of which is incorporated by reference herein in its entirety.

BACKGROUND

1. Field

The present disclosure relates to a wiring material for a semiconductor device, a wiring for a semiconductor device including the same, and/or a semiconductor device including the wiring.

2. Description of Related Art

In recent years, the sizes of semiconductor devices have been gradually decreasing so as to provide high integration of semiconductor devices, and, to this end, it has been necessary to reduce the line width of a wiring in an interconnected structure.

Meanwhile, when the line width of a wiring is reduced, current density in the wiring increases, resulting in an increase in resistance of the wiring.

A copper wiring is generally used as the wiring. Such an increase in the resistance of the wiring may induce electromigration of copper atoms constituting the wiring, resulting in defects in the copper wiring. In addition, a potential reliability problem may arise, including wiring stress migration due to the stress induced in a metal wiring during a process, Cu diffusion from Cu atoms that penetrate into a barrier layer between a gradually-downsized wiring and a dielectric material, or the like. Therefore, there is a gradually increasing need to develop a new wiring material to replace copper.

SUMMARY

An aspect provides a new wiring material for a semiconductor device.

Another aspect provides a wiring for a semiconductor device including the wiring material.

Still another aspect provides a semiconductor device including a wiring including the wiring material.

Additional aspects will be set forth in part in the description which follows and, in part, will be apparent from the description, or may be learned by practice of the presented embodiments of the disclosure.

According to an embodiment, a wiring material for a semiconductor device may include a boride-based compound containing boron and at least one metal selected from elements of Groups 2 to 14.

In some embodiments, the at least one metal may be a Group 5 element, a Group 6 element, or a combination thereof.

In some embodiments, the metal may be tungsten (W), molybdenum (Mo), tantalum (Ta), niobium (Nb), chrome (Cr), vanadium (V), iron (Fe), nickel (Ni), cobalt (Co), titanium (Ti), zirconium (Zr), hafnium (Hf), uranium (U), magnesium (Mg), manganese (Mn), aluminum (Al), dysprosium (Dy), erbium (Er), lanthanum (La), cerium (Ce), indium (In), gallium (Ga), or a combination thereof.

In some embodiments, the metal may be tungsten (W), tantalum (Ta), chrome (Cr), molybdenum (Mo), vanadium (V), or a combination thereof.

In some embodiments, an amount of boron in the boride-based compound may range from 25 at. % to 88 at. %.

In some embodiments, an amount of boron in the boride-based compound may range from 50 at. % to 70 at. %.

In some embodiments, the boride-based compound may be a compound represented by Formula 1:

$$M_a B_b \quad \text{[Formula 1]}$$

In Formula 1,
M may be W, Mo, Ta, Nb, Cr, V, or a combination thereof,
a may be a number of 1 to 5, and
b may be a number of 1 to 10.

In some embodiments, the boride-based compound may be a compound represented by Formula 2:

$$M1_a M2_c B_b \quad \text{[Formula 2]}$$

In Formula 2,
M1 may be W, Mo, Ta, Nb, Cr, Mn, V, Fe, Zr, Ti, Hf, or a combination thereof,
M2 may be Al, Ga, In, or a combination thereof,
a may be a number of 1 to 5,
b may be a number of 1 to 5, and
c may be a number of 1 to 10.

In some embodiments, the boride-based compound may be $WB_2$, $MoB_2$, $TaB_2$, $NbB_2$, $CrB_2$, $CrB$, $MoB$, $VB_2$, $FeB$, $NiB$, $Fe_2B$, $Co_2B$, $Ni_2B$, $TiB_2$, $ZrB_2$, $Hf B_2$, $UB_2$, $MgB_2$, $MnB_2$, $AlB_2$, $DyB_2$, $ErB_2$, $Mn_3B_4$, $DyB_4$, $ErB_4$, $UB_4$, $Mo_2B_5$, $W_2B_5$, $LaB_6$, $CeB_6$, $DyB_6$, $ErB_6$, $MoAlB$, $WAlB$, $Hf_2AlB$, $Hf_2GaB$, $Hf_2InB$, $Ti_2AlB$, $Ti_2GaB$, $Ti_2InB$, $Zr_2AlB$, $Zr_2GaB$, $Zr_2InB$, $Cr_2AlB_2$, $Mn_2AlB_2$, $Fe_2AlB_2$, $Cr_4AlB_6$, or a combination thereof.

In some embodiments, the boride-based compound may have a 1D figure of merit of 6.7 or less.

In some embodiments, the boride-based compound may have a 1D figure of merit of 3 to 6.2.

In some embodiments, the boride-based compound may have a 3D figure of merit of 7.5 or less.

In some embodiments, the boride-based compound may have a 3D figure of merit of 4.5 to 7.5.

In some embodiments, the boride-based compound may have a melting point of 1300° C. or greater.

In some embodiments, the boride-based compound may have a melting point of 2000° C. or greater.

In some embodiments, a wiring may include the wiring material.

In some embodiments, a semiconductor-type device may include a wiring including the wiring material.

In some embodiments, the semiconductor-type device may further include a semiconductor substrate and an interconnected structure on the semiconductor substrate. The interconnected structure may include a dielectric layer on the semiconductor substrate. The dielectric layer may have at least one trench formed therein. The interconnected structure may include the wiring and the wiring may be in the trench.

In some embodiments, the interconnected structure may further include a barrier layer covering the wiring in the trench.

In some embodiments, the trench of the interconnected structure may extend through a thickness of the interconnected structure.

In some embodiments, a depth of the trench may be less than a thickness of the interconnected structure.

In some embodiments, the interconnected structure may further include a liner layer covering the wiring inside the trench.

In some embodiments, the liner layer may expose a top surface of the wiring.

In some embodiments, the liner layer may include a titanium nitride (TiN), titanium tungsten (TiW), tungsten nitride (WN), tantalum nitride (TaN), Ti, Ta, or a combination thereof.

In some embodiments, the interconnected structure may further include a barrier layer covering the wiring inside the trench.

In some embodiments, the barrier layer may have a single layered structure or a multi-layered structure, and the barrier layer may expose a top surface of the wiring.

In some embodiments, the semiconductor-type device may further include a logic device on the semiconductor substrate.

In an embodiment, a wiring material for a semiconductor device may include a boride-based compound represented by Formula 3:

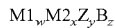  [Formula 3]

$M1_w M2_x Z_y B_z$  [Formula 3]

In Formula 3,
M1 may be W, Mo, Ta, Nb, Cr, Mn, V, Fe, Zr, Ti, Hf, or a combination thereof,
M2 may be Al, Ga, In, or a combination thereof,
w may be a number of 1 to 5,
x may be a number of 1 to 10,
y may be a number of 1 to 5,
z may be a number of 1 to 6,
w and x may be 0 when y is greater than or equal to 1,
y may be 0 when w is greater than or equal to 1, and
y may be 0 when x is greater than or equal to 1.

In some embodiments, in Formula 3, w may be 1 to 4, x may be 1, y may be 1 to 2, z may be 1 to 6, w and x may be 0 when y is 1 to 2, y may be 0 when w is 1 to 4, and y may be 0 when x is 1.

In some embodiments, a semiconductor-type device may include a substrate and a wiring including the wiring material. The wiring may be on the substrate.

In some embodiments, the boride-based compound may be $WB_2$, $MoB_2$, $TaB_2$, $NbB_2$, $CrB_2$, $CrB$, $MoB$, $VB_2$, $FeB$, $NiB$, $Fe_2B$, $Co_2B$, $Ni_2B$, $TiB_2$, $ZrB_2$, $Hf B_2$, $UB_2$, $MgB_2$, $MnB_2$, $AlB_2$, $DyB_2$, $ErB_2$, $Mn_3B_4$, $DyB_4$, $ErB_4$, $UB_4$, $Mo_2B_5$, $W_2B_5$, $LaB_6$, $CeB_6$, $DyB_6$, $ErB_6$, $MoAlB$, $WAlB$, $Hf_2AlB$, $Hf_2GaB$, $Hf_2InB$, $Ti_2AlB$, $Ti_2GaB$, $Ti_2InB$, $Zr_2AlB$, $Zr_2GaB$, $Zr_2InB$, $Cr_2AlB_2$, $Mn_2AlB_2$, $Fe_2AlB_2$, $Cr_4AlB_6$, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 3A and 3C are example views of a method of manufacturing the semiconductor device shown in FIG. 2.

DETAILED DESCRIPTION

Figure 1:
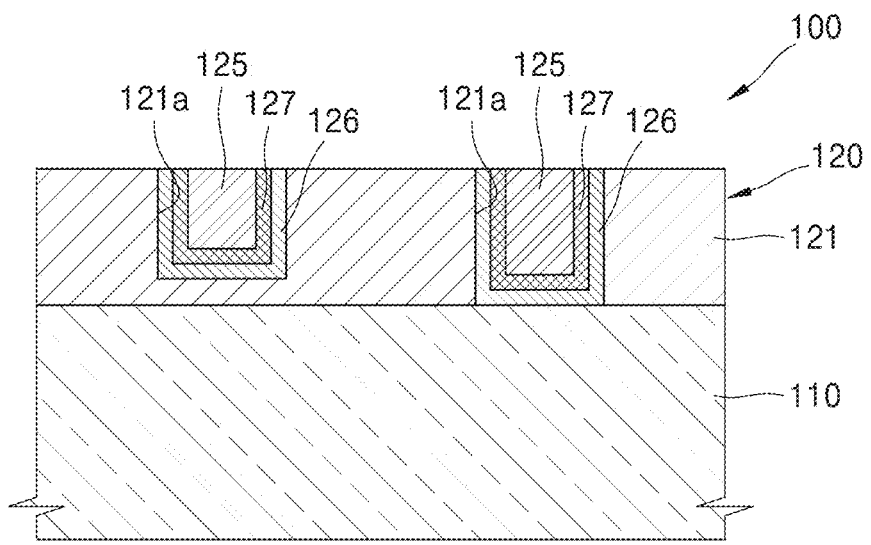
FIG. 1 shows an example semiconductor device according to an embodiment, illustrating a stacked structure of a semiconductor device including an interconnected structure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following: A; B; A and B; A and C; B and C; and A, B, and C.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

A wiring material for a semiconductor device according to an embodiment, a wiring for a semiconductor device including the same, and a semiconductor device (may also be referred to as a semiconductor-type device) including the wiring, will be described in greater detail.

Advantages and features of inventive concepts and a method for achieving them will be apparent with reference to embodiments of the disclosure described below together with the attached drawings. However, inventive concepts are not limited to the disclosed embodiments of the disclosure, but may be implemented in various manners, and the embodiments of the disclosure are provided to complete the disclosure of the technical spirit and to allow those of ordinary skill in the art to understand the scope of inventive concepts. The technical spirit of inventive concepts may be defined by the claims. In some embodiments, well-known techniques will not be described in detail in order to avoid obscuring the description of embodiments of inventive concepts in the present application. Unless otherwise defined, all terms (including technical and scientific terms) used herein have the same meaning as commonly understood by one of ordinary skill in the art to which this inventive concept belongs. In addition, terms, such as those defined in commonly used dictionaries, will not be interpreted in an idealized or overly formal sense unless expressly so defined herein. In addition, it will be understood that the term "comprising" specifies possibility of the addition and/or presence of one or more other components, but does not preclude the possibility of only including the stated components features, unless the context clearly indicates otherwise.

In addition, an expression used in the singular encompasses the expression of the plural, unless it has a clearly different meaning in the context.

In the drawings, the diameters, lengths, and thicknesses of layers and regions are exaggerated or reduced for clarity. Throughout the specification, like reference numerals refer to like elements.

Throughout the specification, it is to be understood that when a component, such as a layer, a film, a region, or a plate, is referred to as being "on" another component, the component can be directly on the other component or intervening components may be present therebetween. In contrast, when an element is referred to as being "directly on" another element, there are no intervening elements.

Provided is a wiring material for a semiconductor device including a boride-based compound containing boron and at least one metal selected from elements of Groups 2 to 14.

Inventive concepts relate to a wiring material that can reduce and/or minimize occurrence of a phenomenon that the resistivity is increased as the device size is reduced. To reduce and/or minimize reliability deterioration caused by using existing wiring materials, and to reduce and/or minimize the increase in resistivity occurring when the wiring pattern size is reduced, a new wiring material that can replace the existing wiring material is required.

Copper is known as the wiring material. However, in a semiconductor device using a wiring made of copper, the resistivity is considerably increased as the device size is reduced, because copper has a relatively long mean free path despite its low bulk resistivity. As a result, current may not flow well in the semiconductor device, and thus the performance of the semiconductor device may be crucially affected. Accordingly, it may be necessary to develop a new wiring material capable of replacing the Cu wiring using as an interconnect.

While development of wiring materials having low bulk resistivity and processes therefor has conventionally been the major concern, how low the product of the bulk resistivity ($\rho 0$) and the mean free path ($\lambda$) has recently become an important gauge in determining the size effect. The product of the bulk resistivity ($\rho 0$) and the mean free path ($\lambda$) is expressed as a figure of merit. The lower the product of the bulk resistivity ($\rho 0$) and the mean free path ($\lambda$), that is, the lower the bulk resistivity ($\rho 0$) and the shorter the mean free path ($\lambda$) of a material, the more advantageous in maintaining the resistivity even if the device size is reduced.

Cu has a mean free path of about 39 nm, which is relatively large, and sensitively reacts to the size effect as the device size is reduced. Therefore, using a material having a short mean free path as a new wiring material for replacing the conventional copper wiring may make the wiring material become insensitive to the size effect occurring when the device size is reduced.

When figures of merit for various materials are examined based on the Ab initio calculation result, Rh, Pt, Ir, Nb, etc. have a low figure of merit, and thus may be less affected by the size effect according to the scaling of the device size.

However, since such materials have low process maturity and may require high process costs, it may be impractical to use the materials in a semiconductor process.

In order to provide a size effect with respect to electrical conductivity and excellent reliability of a wiring material, the wiring material should have a high melting point.

Given the foregoing matters, the present inventors have conducted research into a new wiring material having a short mean free path and being insensitive to the size effect to replace the conventional copper wiring material, and finally completed wiring materials according to inventive concepts, a wiring including the wiring material, and a semiconductor device including the wiring.

The new wiring material, according to inventive concepts, provides a boride-based compound containing boron and at least one metal selected from the group consisting of elements of Groups 2 to 14. The boride-based compound, which is a compound of boron and a metal element, generally has properties of an intermetallic compound, a similar appearance to a metal, quite high rigidity, and a high melting point of 1300° C. or greater, for example, 2000° C. or greater, and is chemically inert and superb in view of thermal and electrical conductivities.

Among the boride-based compound according to an embodiment, for example, $ZrB_2$ and $TiB_2$ have quite high thermal and electrical conductivities, that is, about 10 times those of a metal. To investigate the size effect of this material with respect to electrical conductivity, the figure of merit was obtained by the first principle calculations, and the result confirmed that this material had very good figure of merit, compared to Cu that is currently widely used as a wiring material.

In the wiring material for a semiconductor device including a boride-based compound according to an aspect, the metal may be, for example, a Group V element, a Group 6 element, or a combination thereof.

The Groups 2 to 14 metals include tungsten (W), molybdenum (Mo), tantalum (Ta), niobium (Nb), chrome (Cr), vanadium (V), iron (Fe), nickel (Ni), cobalt (Co), titanium (Ti), zirconium (Zr), hafnium (Hf), uranium (U), magnesium (Mg), manganese (Mn), aluminum (Al), dysprosium (Dy), erbium (Er), lanthanum (La), cerium (Ce), indium (In), gallium (Ga), or a combination thereof.

In an embodiment, the metal is, for example, a Group 5 element, a Group 6 element, or a combination thereof. In addition, the metal is W, Ta, Cr, Mo, V, or a combination thereof.

In the boride-based compound according to an aspect, the boron content is in a range of 25 to 88 atomic % (at. %).

According to another aspect, the boron content is, for example, 50 at. % or greater, or 50 to 70 at. %. When the boron content is in the above-described range, it is possible to limit and/or prevent a potential reliability problem, such as wiring stress migration due to the stress induced to a metal wiring during a process, or diffusion of Cu atoms having penetrated into a barrier layer between a gradually downscaled wiring and a dielectric material.

For example, in an embodiment, the boride-based compound is a compound represented by Formula 1:

  [Formula 1]

In Formula 1, M is W, Mo, Ta, Nb, Cr, V, or a combination thereof; and a is a number of 1 to 5, and b is a number of 1 to 10.

In Formula 1, a may be a number of 1 to 3 or a number of 1 or 2, and b may be a number of 1 to 6 or a number of 1 to 5.

The boride-based compound may be a compound represented by Formula 2:

$$M1_aM2_cB_b \quad \text{[Formula 2]}$$

In Formula 2, M1 is W, Mo, Ta, Nb, Cr, Mn, V, Fe, Zr, Ti, Hf, or a combination thereof; M2 is Al, Ga, In, or a combination thereof; and a is a number of 1 to 5, b is a number of 1 to 5, and c is a number of 0 to 10 and/or c is a number of 1 to 10.

In Formula 2, in an embodiment, a is a number of 1 to 4 or a number of 1 or 2, c is a number of 1 to 3 or a number of 1 or 2, b is a number of 1 to 5, a number of 1 to 5 or a number of 1 or 2.

In an embodiment, boride-based compound may be a compound represented by Formula 3:

$$M1_wM2_xZ_yB_z \quad \text{[Formula 3]}$$

In Formula 3,
M1 may be W, Mo, Ta, Nb, Cr, Mn, V, Fe, Zr, Ti, Hf, or a combination thereof,
M2 may be Al, Ga, In, or a combination thereof,
w may be a number of 1 to 5,
x may be a number of 1 to 10,
y may be a number of 1 to 5,
z may be a number of 1 to 6,
w and x may be 0 when y is greater than or equal to 1,
y may be 0 when w is greater than or equal to 1, and
y may be 0 when x is greater than or equal to 1.

In some embodiments, in Formula 3, w may be 1 to 4, x may be 1, y may be 1 to 2, z may be 1 to 6, w and x may be 0 when y is 1 to 2, y may be 0 when w is 1 to 4, and y may be 0 when x is 1.

The compound of Formula 1, the compound of Formula 2, and the compound of Formula 3 may include single crystals or polycrystals (e.g., polycrystalline).

In the compound of Formula 1, M and B may be mixed at an atomic ratio of 1:0.3 to 1:6, for example, 1:0.33 to 1:2.5. When the mixing ratio of M and B in the compound of Formula 1 is in the above-described range, the wiring material for a semiconductor device formed therefrom has a reduced increment in the resistivity due to a reduction in the line width of wiring, compared to the copper wiring, and has a high melting point.

In the compound of Formula 2, a sum of M1 and M2 and B may be mixed at an atomic ratio of 1:0.3 to 1:6, for example, 1:0.33 to 1:2. In the compound of Formula 2, when the mixing ratio of a sum of M1 and M2 and B is in the above range, the wiring material for a semiconductor device formed therefrom has a reduced increment in the resistivity due to a reduction in the line width of wiring, compared to the copper wiring, and has a high melting point.

According to an embodiment, when an atomic ratio of M and B mixed in the compound of Formula 1 is 1:2 and when an atomic ratio of the sum of M1 and M2 and B mixed in the compound of Formula 1 is 1:2, the compound may have an atomic arrangement in which a metal layer and a boron layer are alternately stacked and may have a layered crystal structure.

In the layered crystal structure, unit structure layers are connected to one another by a van der Waals force, and thus enable interlayer sliding and may be fabricated to provide nanosheets by mechanical exfoliation or liquid exfoliation, thereby providing a thin film having excellent flexibility and high electrical conductivity. Therefore, the wiring material according to an embodiment is useful for a wiring for a semiconductor device.

The boride-based compound as the wiring material for a semiconductor device may include, for example, $WB_2$, $MoB_2$, $TaB_2$, $NbB_2$, $CrB_2$, $CrB$, $MoB$, $VB_2$, $FeB$, $NiB$, $Fe_2B$, $Co_2B$, $Ni_2B$, $TiB_2$, $ZrB_2$, $HfB_2$, $UB_2$, $MgB_2$, $MnB_2$, $AlB_2$, $DyB_2$, $ErB_2$, $Mn_3B_4$, $DyB_4$, $ErB_4$, $UB_4$, $Mo_2B_5$, $W_2B_5$, $LaB_6$, $CeB_6$, $DyB_6$, $ErB_6$, $MoAlB$, $WAlB$, $Hf_2AlB$, $Hf_2GaB$, $Hf_2InB$, $Ti_2AlB$, $Ti_2GaB$, $Ti_2InB$, $Zr_2AlB$, $Zr_2GaB$, $Zr_2InB$, $Cr_2AlB_2$, $Mn_2AlB_2$, $Fe_2AlB_2$, $Cr_4AlB_6$, or a combination thereof.

The boride-based compound according to an embodiment may include, for example, $WB_2$, $MoB_2$, $TaB_2$, $NbB_2$, $CrB_2$, $CrB$, $MoB$, $VB_2$, or a combination thereof. Among the boride-based compounds, $WB_2$ and $MoB_2$ have a hexagonal system.

The boride-based compound has a 1D figure of merit of 6.7 or less. The 1D figure of merit of the boride-based compound is less than 6.7, 1 to 6.5, 2 to 6.4, or 3 to 6.2.

The boride-based compound has a 3D figure of merit of 7.5 or less, 3 to 7.5, or 4.5 to 7.5. When the values of 1D and 3D figures of merit of the boride-based compound are in the above-described ranges, the increment in the resistivity due to a reduction in the line width of the wiring formed therefrom is reduced, compared to the copper wiring, and thus excellent reliability can be maintained even if a semiconductor device is downscaled.

In the present specification, the values of 1D or 3D figures of merit are obtained using simulation programs, Vienna Ab initio simulation package (VASP) and Boltzmann transport properties (BoltzTraP), according to quantum mechanics based First Principle. As to the figure of merit evaluation, the content disclosed in a document entitled "Metals for low-resistivity interconnects", Daniel Gall, 2018 IEEE 157-159, is herein incorporated by reference.

The boride-based compound may have a melting point of 1300° C. or greater, for example, 2000° C. or greater.

According to an embodiment, the melting point of the boride-based compound is 1350 to 3500° C., 1500 to 3100° C., or 2000 to 3500° C. or 2100 to 3200° C. When the melting point of the boride-based compound is in the above-described range, the increment in the resistivity of the wiring formed therefrom, due to a reduction in the line width of the wiring, is reduced, compared to the copper wiring, and the melting point thereof is high, thereby maintaining excellent reliability even if a semiconductor device is downscaled.

The boride-based compound used as a wiring material according to an aspect may be a compound having, for example, a layered crystal structure.

The boride-based compound according to an aspect, which is a compound of boron and at least one metal element, generally has properties of an intermetallic compound, a similar appearance to a metal, quite high rigidity, and a high melting point of 1300° C. or greater, for example, 2000° C. or greater, and is chemically inert and superb in view of thermal and electrical conductivities. In addition, such compounds are chemically inert, and specifically, $ZrB_2$ and $TiB_2$ among the boride-based compounds have quite high thermal and electrical conductivities, that is, about 10 times those of a metal.

As described above, most of the wiring material according to an embodiment has a high melting point while having a 1D or 3D figure of merit equal to or lower than Cu that is currently used as a wiring material.

Among the boride-based compounds, the boride-based compound containing a Group 5 or 6 element has a better figure of merit and a higher melting point than Cu. In addition, the increment in the resistivity due to a reduction in the line width of the wiring is reduced, and thus excellent reliability can be maintained even if a semiconductor device is downscaled.

The boride-based compound according to an embodiment may be prepared by forming a metal boride target having a desired composition and then sputtering the same to form a thin film, followed by performing heat treatment at a crystallization temperature. The temperature and time of heat treatment may vary according to the kind of metal or the composition of the boride-based compound desired.

Commercially available boride-based compounds may be used as the boride-based compounds, or a compound prepared using a metal precursor and a boron precursor as raw materials may be used as the boride-based compounds.

According to an embodiment, the boride-based compound may be prepared by a deposition process, a sputtering process, an arc melting process, a solid-state reaction process, or a quartz ampoule process, using, as raw materials, a metal precursor and a boron precursor.

As the metal precursor, metal powder containing W, Mo, Ta, Nb, Cr, V, Fe, Ni, Co, Ti, Zr, Hf, U, Mg, Mn, Al, Dy, Er, La, Ce, Al, Ga, In, or a combination thereof, a metal compound or a mixture thereof, may be used. As the metal compound, a metal oxide, etc. may be used. In addition, as the boron precursor, boron powder, a boron oxide, etc. may be used.

According to the solid-state reaction process, a target product may be prepared by mixing raw material powder to make pellets and then performing heat treatment on the obtained pellets, or performing heat treatment on a raw material powder mixture, forming pellets and then sintering the pellets. In addition, according to the quartz ampoule process, a target product may be prepared by introducing raw material elements into a quartz tube or a metal ampoule, sealing in vacuum, performing heat treatment for a solid-state reaction or melting.

When a boride-based compound is prepared by an arc melting process, raw material elements are introduced into a chamber, an arc discharge is performed in an inert gas (e.g., nitrogen, argon, etc.) atmosphere for melting the raw material elements, followed by solidifying.

The raw material may be powder or a bulk material (e.g., pellets). When necessary, the raw material powder may be uniaxially pressed to be formed as a bulk material. The arc melting process may include performing arc melting two or more times while overturning top and bottom surfaces of pellets to be uniformly heat-treated. The intensity of current applied during the arc melting process is not particularly limited, and may be 50 A or greater, for example, 200 A or greater, but not limited thereto. The intensity of current applied during the arc melting process may be 350 A or less, for example, 300 A or less, but not limited thereto.

According to another aspect, provided is a wiring for a semiconductor device including a wiring material according to an embodiment.

The wiring may have a layered structure and may include a single layer or multiple layers. The layer(s) may have a thickness of, for example, 50 nm or less, 30 nm or less, 20 nm or less, 10 nm or less, 1 nm to 10 nm or 1 nm to 5 m.

The wiring for a semiconductor device according to an embodiment has low resistivity.

According to still another aspect, provided is a semiconductor device including a wiring containing the wiring material according to an embodiment.

The semiconductor device may include a semiconductor substrate; and an interconnected structure provided on the semiconductor substrate. The interconnected structure may include a dielectric layer provided on the semiconductor substrate and having at least one trench; and a wiring provided to fill the inside of the trench.

The wiring may include a boride-based compound containing boron and one of Group 2 to 14 metals.

The interconnected structure further includes a barrier layer provided to cover the wiring inside the trench. In addition, the trench of the interconnected structure is formed to contact the substrate or not to contact the substrate.

The interconnected structure may further include a liner layer provided to cover the wiring inside the trench. The liner layer may have a structure of a single layer or multiple layers.

The interconnected structure may further include a barrier layer provided to cover the wiring inside the trench, and the barrier layer may have a structure of a single layer or multiple layers.

The barrier layer is provided to expose the top surface of the wiring.

The semiconductor device according to an embodiment includes a logic device provided on the semiconductor substrate.

The semiconductor device according to an embodiment comprises a wiring including a wiring material containing the boride-based compound according to an embodiment, a liner layer and a dielectric layer. The liner layer may function as both of a metal seed layer and a diffusion preventing layer. Therefore, the semiconductor device does not require a barrier layer.

Hereinafter, a semiconductor device according to an embodiment will be described in detail with reference to the accompanying drawings.

FIG. 1 shows a semiconductor device 100 including an interconnected structure 120 according to an embodiment.

Referring to FIG. 1, the semiconductor device 100 includes a semiconductor substrate 110 and an interconnected structure 120 provided on the semiconductor substrate 110. Here, the interconnected structure 120 may include a dielectric layer 121, a wiring 125, a liner layer 127 and a barrier layer 126.

The semiconductor substrate 110 may include, for example, a Group 4 semiconductor material, a Group 3/5 semiconductor compound, or a Group 2/6 semiconductor compound. Specifically, the semiconductor substrate 110 may include Si, Ge, SiC, SiGe, SiGeC, Ge Alloy, GaAs, InAs, InP, or the like. However, this is merely an example, and other various semiconductor materials may be used as the substrate 110.

The semiconductor substrate 110 may include a single layer or multiple layers in which different materials are stacked. The semiconductor substrate 110 may include, for example, a silicon-on-insulator (SOI) substrate or a silicon germanium-on-insulator (SGOI) substrate. In addition, the substrate 110 may include a non-doped semiconductor material or a doped semiconductor material.

The substrate 110 may include at least one semiconductor device (not shown). Here, the semiconductor device may include, for example, at least one of a transistor, a capacitor, a diode, and a resistor. However, examples of the semiconductor device are not limited thereto.

The dielectric layer 121 is formed on the semiconductor substrate 110. The dielectric layer 121 may have a single layered structure or a multi-layered structure in which different materials are stacked. The dielectric layer 121 may include a dielectric material used in a typical semiconductor manufacturing process. For example, the dielectric layer 121 may include silicon oxide, silicon nitride, silicon carbide, silicate, or the like. However, this is merely an example, and other various dielectric materials may be used as the dielectric layer 121. The dielectric layer 121 may also include an organic dielectric material.

At least one trench 121a is formed in the dielectric layer 121 to a certain depth. The at least one trench 121a may be formed not to contact the substrate 110 or to contact the substrate 110. Two trenches 121a are formed in the dielectric layer 121 in FIG. 1, wherein one of the trenches 121a is formed not to contact the substrate 110 while the other is formed to contact the substrate 110.

The wiring 125 is provided to fill the inside of the trench 121a. The wiring 125 may include a boride-based compound according to an embodiment.

The wiring 125 according to an embodiment may reduce electrical resistance, thereby improving electromigration resistance. A barrier layer 126 is provided on the inner wall of the trench 121a. The barrier layer 126 may be provided to cover the wiring 125 between the dielectric layer 121 and the wiring 125. Specifically, the barrier layer 126 may be provided on the inner wall of the trench 121a so as to cover the side and bottom surfaces of the wiring 125. The top surface of the wiring 125 may be exposed by the barrier layer 126. The barrier layer 126 may serve to limit and/or prevent diffusion of the material forming the wiring 125. Meanwhile, the barrier layer 126 may additionally serve as an adhesion layer between the dielectric layer 121 and the wiring 125.

The barrier layer 126 may have a single layered structure or a multi-layered structure in which different materials are stacked. The barrier layer 126 may include, for example, a metal, a metal alloy, or a metal nitride. Specifically, the barrier layer 126 may include Ta, Ti, Ru, RuTa, IrTa, W, TaN, TiN, RuN, TuTaN, IrTaN, or WN. However, this is merely an example, and other various materials may be used as the barrier layer 126.

The liner layer 127 is provided on the barrier layer 126 disposed on the inner wall of the trench 121a. Here, the liner layer 127 may be provided to cover the wiring 125 between the dielectric layer 121 and the wiring 125. Specifically, the liner layer 127 may be provided on the inner wall of the trench 121a so as to cover the side and bottom surfaces of the wiring 125.

The liner layer 127 may include, for example, titanium nitride (TiN), titanium tungsten (TiW), tungsten nitride (WN), tantalum nitride (TaN), Ti, Ta, or a combination thereof. The liner layer 127 may be formed of a single layer or multiple layers in which different materials are stacked. In addition, the liner layer 127 may be formed by chemical vapor deposition (CVD), atomic layer deposition (ALD), or metal organic chemical vapor deposition (MOCVD).

The top surface of the wiring 125 may be exposed by the liner layer 127. The liner layer 127 may limit and/or prevent diffusion of the boride-based compound forming the wiring 125 and may serve as a plating seed layer. In addition, like the barrier layer 126, the liner layer 127 may also serve as an adhesion layer between the dielectric layer 121 and the wiring 125.

Figure 2:
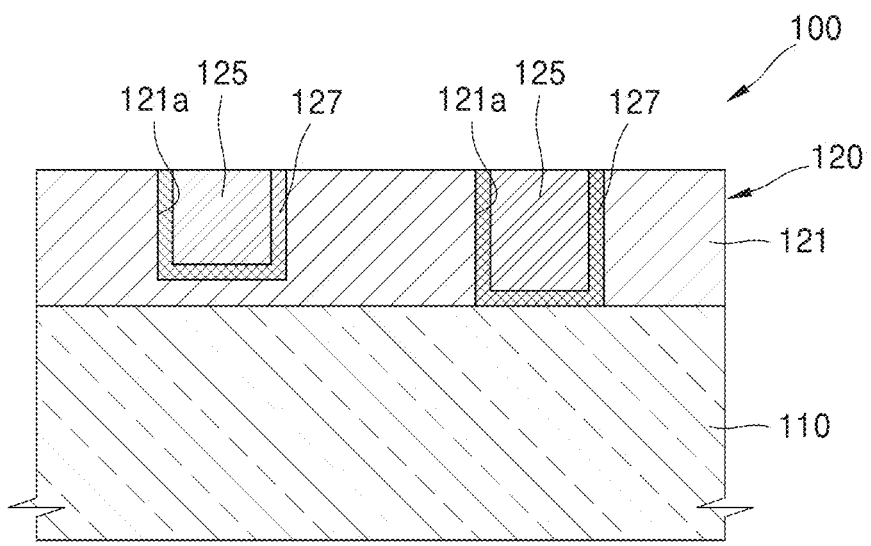
FIG. 2 shows an example semiconductor device according to another embodiment, illustrating a stacked structure of a semiconductor device including an interconnected structure.

FIG. 2 shows a semiconductor device 100 including an interconnected structure 120 according to another embodiment.

Referring to FIG. 2, the liner layer 127 is provided on the inner wall of the trench 121a. Here, the liner layer 127 may be provided to cover the wiring 125 between the dielectric layer 121 and the wiring 125. The liner layer 127 may include, for example, includes titanium nitride (TiN), titanium tungsten (TiW), tungsten nitride (WN), tantalum nitride (TaN), Ti, Ta, or a combination thereof.

Unlike in FIG. 1, the device shown in FIG. 2 does not have to use a barrier layer. That is, the barrier layer may not be formed because the liner layer 127 is capable of limiting and/or preventing diffusion of boron of the boride-based compound.

Figure 3A:
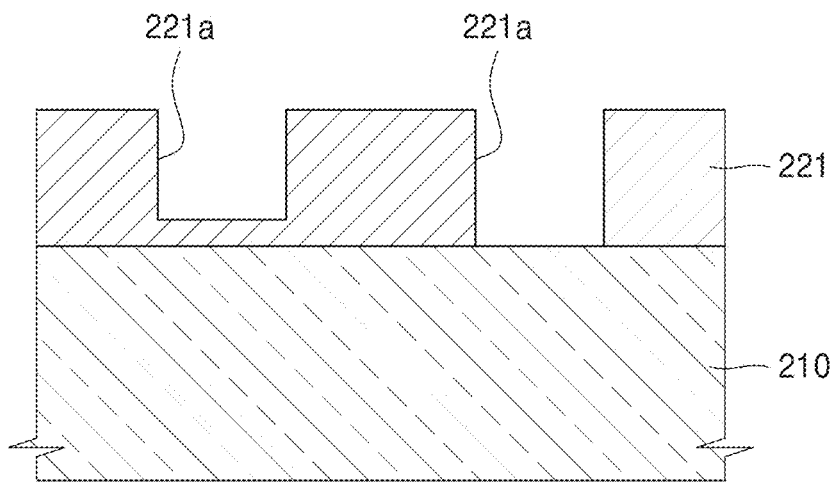
FIGS. 3A and 3B are example views of a method of manufacturing the semiconductor device shown in FIG. 1.
Figure 3B:
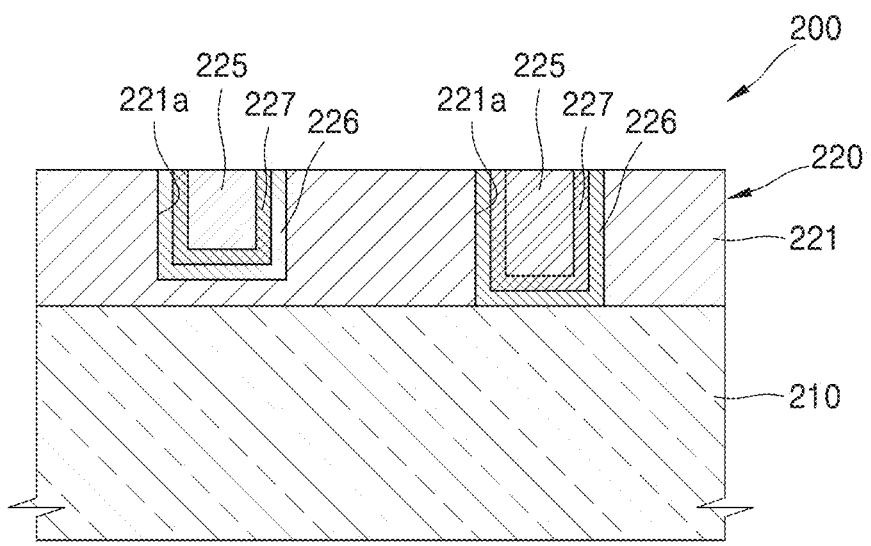
Figure 3C:
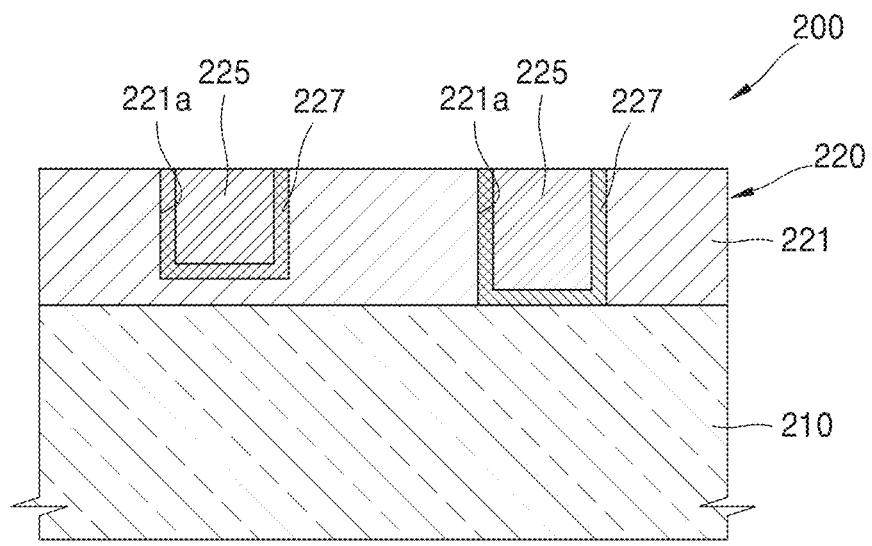

FIGS. 3A and 3B are example views of a method of manufacturing the semiconductor device 100 including the interconnected structure 120 shown in FIG. 1. FIGS. 3A and 3C are example views of a method of manufacturing the semiconductor device 100 including the interconnected structure 120 shown in FIG. 2.

Referring to FIG. 3A, a dielectric layer 221 including at least one trench 221a is formed on a semiconductor substrate 210. Specifically, the dielectric layer 221 is first formed on the semiconductor substrate 210. Here, the dielectric layer 221 may be formed by a deposition process used in a typical semiconductor manufacturing process, for example, chemical vapor deposition (CVD), plasma enhanced CVD (PECVD), or spin coating.

For example, the semiconductor substrate 210 may include a Group 4 semiconductor material, a Group 35 semiconductor compound or a Group 2/6 semiconductor compound. The semiconductor substrate 210 may include a single layer or multiple layers in which different materials are stacked. In addition, the semiconductor substrate 210 may include, for example, a silicon-on-insulator (SOI) substrate or a silicon germanium-on-insulator (SGOI) substrate. The semiconductor substrate 210 may include a non-doped semiconductor material or a doped semiconductor material.

The semiconductor substrate 210 may include at least one semiconductor device (not shown). Here, the semiconductor device may include, for example, at least one of a transistor, a capacitor, a diode, and a resistor, but not limited thereto.

The dielectric layer 221 may include a dielectric material used in a typical semiconductor manufacturing process. For example, the dielectric layer 221 may include silicon oxide, nitride, silicon nitride, silicon carbide, silicate, or the like. However, this is merely an example, and other various dielectric materials may be used as the dielectric layer 221. The dielectric layer 221 may also include an organic dielectric material. The dielectric layer 221 may have a single layered structure or a multi-layered structure in which different materials are stacked.

Next, at least one trench 221a is formed in the dielectric layer 221 to a certain depth. The at least one trench 121a may be formed by, for example, a photolithography process or an etching process. Here, the at least one trench 121a may be formed not to contact the substrate 210 or to contact the substrate 210. Two trenches 221a are formed in the dielectric layer 221 in FIG. 3A, wherein one of the trenches 221a is formed not to contact the substrate 210 while the other is formed to contact the substrate 210.

Next, a wiring 225, a liner layer 227 and a barrier layer 226 are formed inside the at least one trench 221a formed in the dielectric layer 221. First, the barrier layer 226 and the liner layer 227 are sequentially formed on the surface of the dielectric layer 221. Here, the barrier layer 226 and the liner layer 227 may be formed through a deposition process used in a typical semiconductor manufacturing process.

The barrier layer 226 and the liner layer 227 may include, for example, a metal, a metal alloy, or a metal nitride. However, examples of the barrier layer 226 and the liner layer 227 are not limited thereto. The barrier layer 226 and the liner layer 227 may have a single layered structure or a multi-layered structure in which different materials are stacked.

Next, a wiring 225 is formed on the surface of the liner layer 227 so as to fill the inside of the at least one trench 221a. The wiring 225 may be formed by, for example, chemical vapor deposition (CVD), plasma enhanced CVD (PECVD), physical vapor deposition (PVD), electroplating, chemical solution deposition, or electroless plating using the boride-based compound according to an embodiment.

When the wiring 225 is formed by electroplating, before forming the wiring 225, a plating seed layer (not shown) for facilitating electroplating may be formed on the surface of the liner layer 227. When the liner layer 227 serves as a plating seed layer, the plating seed layer may not be formed.

The plating seed layer may include, for example, copper (Cu), a copper alloy, iridium (Ir), an iridium alloy, ruthenium (Ru) or a ruthenium alloy, which is, however, merely an example.

The wiring 225 may include the boride-based compound according to an embodiment.

The wiring 225 may further include a metal or a metal alloy having excellent electrical conductivity, as necessary. For example, the wiring 225 may include Cu, Ru, Al, Co, W, Mo, Ti, Ta, Ni, Pt, Cr, or an alloy thereof. However, embodiments are not limited thereto, and other various metals may be used as the wiring 225.

Next, the top surface of the dielectric layer 221, the top surface of the liner layer 227, the top surface of the barrier layer 226 and the top surface of the wiring 225 are processed to be coplanar through a planarization process. The planarization process may include, for example, a chemical mechanical polishing (CMP) process or a grinding process, but not limited thereto.

The semiconductor device of FIG. 1 is completed through the manufacturing process.

A method of manufacturing the semiconductor device of FIG. 2 will now be described with reference to FIGS. 3A and 3C.

The semiconductor device of FIG. 2 may be manufactured in the same manner as the semiconductor device of FIG. 1, except that a barrier layer is not formed in the manufacturing method of the semiconductor device of FIG. 1.

Referring to FIG. 3C, the dielectric layer 221 is formed on the semiconductor substrate 210.

Next, at least one trench 221a is formed in the dielectric layer 221 to a certain depth. Here, the at least one trench 121a may be formed not to contact the semiconductor substrate 210 or to contact the semiconductor substrate 210. Two trenches 221a are formed in the dielectric layer 221 in FIG. 3C, wherein one of the trenches 221a is formed not to contact the substrate 210 while the other is formed to contact the substrate 210.

Next, the wiring 225 and the liner layer 227 are formed inside the at least one trench 221a formed in the dielectric layer 221. First, the liner layer 227 is formed on the surface of the dielectric layer 221.

Next, the wiring 225 is then formed on the surface of the liner layer 227 so as to fill the inside of the at least one trench 221a.

The wiring 225 includes the boride-based compound according to an embodiment.

The liner layer 227 may have a single layered structure or a multi-layered structure in which different materials are stacked. The liner layer 227 may limit and/or prevent diffusion of the boride-based compound of wiring, and may also serve as a plating seed layer.

Next, the top surface of the dielectric layer 221, the top surface of the liner layer 127, and the top surface of the wiring 225 are processed to be coplanar through a planarization process, thereby completing the semiconductor device of FIG. 2.

Figure 4:
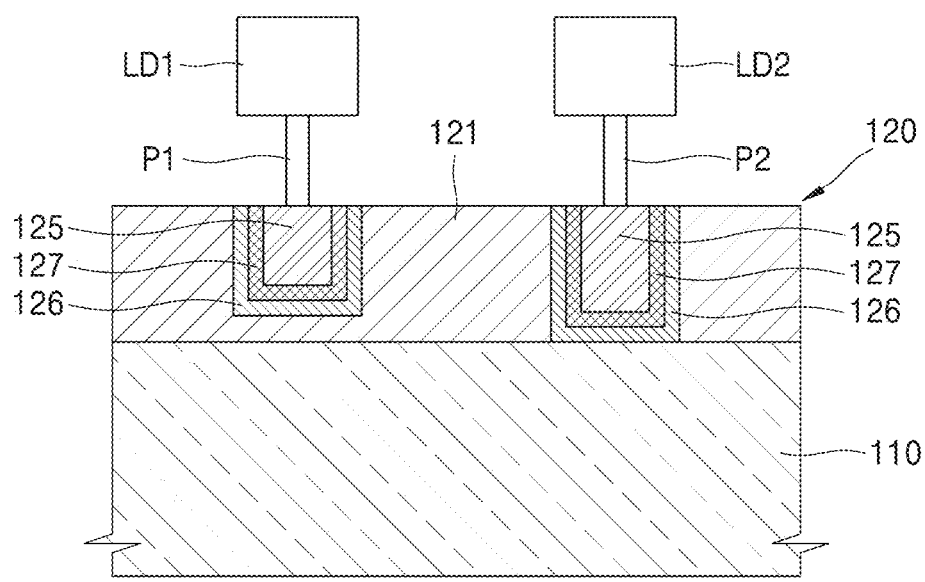
FIG. 4 shows an example semiconductor device according to an embodiment, further including a logic device.

The semiconductor device according to an embodiment may include a logic device provided on a semiconductor substrate. The logic device may be, for example, a metal-oxide semiconductor (MOS) transistor. For example, as depicted in FIG. 4, in an embodiment, a first logic device LD1 may be connected to a wiring 125 through a plug P1 and a second logic device LD2 may be connected to a wiring 125 through a plug P2. The plugs P1 and P2 may include conductive materials, such as a metal, a metal alloy, or one of the boride-based compounds according embodiments of inventive concepts. Each logic device LD1 and LD2 may be a MOS transistor, but example embodiments are not limited thereto and other types of devices such as a capacitor may be provided in place of the logic devices LD1 and LD2.

Hereinafter, the figure of merit of the boride-based compound according to an embodiment will be described.

The values of 1D or 3D figure of merit of the boride-based compound according to an embodiment is a typical parameter expressing the size effect of resistivity and can be obtained by the following Equations 1 and 2.

$$1D \text{ figure of merit } \rho\lambda = \rho \times \lambda_{1D} \quad \text{[Equation 1]}$$

$$3D \text{ figure of merit } \rho\lambda = \rho \times \lambda_{3D} \quad \text{[Equation 2]}$$

In Equations 1 and 2, $\rho$ represents a bulk resistivity, and $\lambda$ represents a mean free path. $\lambda_{1D}$ represents a mean free path in one direction, and $\lambda_{3D}$ represents a mean free path in 3D, that is, bulk.

The 1D figure of merit $\rho\lambda$ ($\rho \times \lambda_{1D}$) represents a figure of merit in an in-plane direction, and the 3D figure of merit $\rho\lambda$ ($\rho \times \lambda_{3D}$) represents a figure of merit in an isotropic bulk state.

The lower the value of the figure of merit of the boride-based compound, that is, the lower the bulk resistivity ($\rho 0$) and the shorter the mean free path ($\lambda$) of a material, the more advantageous in maintaining the resistivity even if the device size is reduced. In addition, this also means that the material may become insensitive to the size effect occurring as the size of device is reduced.

Now, the compositions of boride-based compounds are listed in Table 1 below.

TABLE 1

| Classification | Boride-based compound composition | Classification | Boride-based compound composition |
|---|---|---|---|
| Example 1 | $WB_2$ | Example 9 | FeB |
| Example 2 | $MoB_2$ | Example 10 | $Fe_2B$ |
| Example 3 | $TaB_2$ | Example 11 | $Ni_2B$ |
| Example 4 | $NbB_2$ | Example 12 | $MnB_2$ |
| Example 5 | $CrB_2$ | Example 13 | $AlB_2$ |
| Example 6 | CrB | Example 14 | $Mo_2B_5$ |
| Example 7 | MoB | Example 15 | $W_2B_5$ |
| Example 8 | $VB_2$ | Example 16 | $Cr_2AlB_2$ |
| Comparative Example 1 | Cu | | |

In the present specification, the term "figure of merit" is a value obtained using simulation programs, Vienna Ab initio simulation package (VASP) and Boltzmann transport properties (BoltzTraP), according to quantum mechanics based First Principle, and the figure of merit $\rho_0\lambda$ is obtained through model analysis of the electron band structure in space and the fermi surface.

The electron structure of a material used for measuring figure of merit is calculated by projector augmented wave potentials using Perdew-Burke-Ernzerhof (PBE) generalized gradient approximation, 500 eV is set to a plane-wave energy cutoff, and 60*60*60 K-point sampling is employed.

As to specific simulation methodology for providing the figure of merit, reference can be further made to a document entitled "Vienna Ab-initio Simulation Package" (written by GeorgKresse and Jurgen Furthmuller, Institut fur Materialphysik, Universitat Wien, Sensengasse 8, A-1130 Wien, Austria, Aug. 24, 2005). The content disclosed in the document may be incorporated by reference herein in its entirety.

The figure of merit may be obtained from crystal structure of various metal diboride compounds by calculating the density of state (DOS) and band structure around fermi levels.

The above-described simulation procedures can be summarized in Table 2 below.

ics equation. The first principles calculation is a calculation using fundamental equations without external parameters.

The electronic state of a material is calculated using the VASP (Vienna Ab initio simulation package) code, which is a first principles DFT code. Then, a candidate material group including two-dimensional electron gas (2DEG) is selected using the Inorganic Crystal Structure Database (ICSD), information about the atomic structure thereof is input, and the energy level for the electrons is then calculated by simulation. Next, for such electrons, an energy density function and a state density function on a k-space are calculated.

The electron structure calculated through the DFT computer simulation provides information about an E-k diagram (band structure) and DOS (Density of State: electron state density, electron state density function per energy unit). Depending on the presence of the DOS on the maximum energy level (E) available to the electrons, it is possible to determine whether the given material is a metallic conductive material (DOS(E)>0) or a semi-conductor material (DOS(E)=0).

TABLE 2

| Calculation | Simulation level | Calculation/simulation |
|---|---|---|
| Atomic electron structure | DFT | Structure optimization<br>Band structure calculation |
| Conductance characteristic | Semi-Boltzmann transport classical | [Equation 3]<br>$\frac{\sigma_t}{\tau} = \frac{1}{\tau\rho_t} = \frac{e^2}{4\pi^3\hbar}\sum_n\int_{S_{F,n}} dS \frac{|v_{n,t}(k)|^2}{|v_n(k)|}$<br><br>[Equation 4]<br>$\lambda_{n,t}(k) = |v_{n,t}(k)|$<br><br>[Equation 5]<br>$(\rho_0\lambda)^{-1} = \frac{e^2}{4\pi^3\hbar}\sum_n\left(\int_{S_{F,n}} dS \frac{|v_{n,t}(k)|^2}{|v_n(k)|}\right)\left(\int_{S_{F,n}} dS|v_{n,t}(k)|\right)^{-1}$ |

In Table 2, DFT is an abbreviation of density-functional theory, $\tau$ is relaxation time, at is electrical conductivity for the direction t, $\rho t$ is specific resistivity for the direction t, dS is a differential area of Fermi surface, $v_{n,t}(k)$, $|v_n(k)|$ and are the fermi velocity for the direction t and the norm of fermi velocity, respectively, for the crystal momentum k. In addition, $v_n(k)$ may be obtained from the E-k diagram.

In Equation 3 of Table 2, $\tau$ is a relaxation time, $\sigma_\tau$ is electrical conductivity for the direction t, $\rho_\tau$ is specific resistivity for the direction t, dS is a differential area of Fermi surface, $v_{n,t}(k)$ and $|v_n(k)|$ are the fermi velocity for the direction t and the norm of fermi velocity, respectively, for the crystal momentum k. Then, using Equation 4, the figure of merit $\rho_0\lambda$ PGA may be expressed by the semi-classical Boltzman equation of Equation 5.

The description of Table 2 will now be explained in further detail.

In order to calculate a quantum mechanical state of a material, the distribution of electrons is described using an electron density function based on density-functional-theory (DFT), instead of a wave function. According to this approach, the quantum mechanical state of electrons for the material is calculated by performing first principles calculation based on the method for solving the quantum mechan- To predict the figure of merit of the boride-based compound as a metal conducting material, a semi-classical Boltzmann transport model may be introduced and the figure of merit of the boride-based compound may be analyzed using Equations 3 to 5 of Table 1.s The evaluation results of the 1D figures of merit, 3D figures of merit and melting points of the boride-based compounds, obtained in the above-described manner, are shown in Table 3. The melting points of the boride-based compounds is measured by Differential Scanning calorimetry (DSC) and/or Differential Thermal Analysis (DTA). Information on the melting point of boride-based compounds can be found from known literature.

TABLE 3

| Classification | Boride-based compound composition | $\rho\lambda$ (1D) | $\rho\lambda$ (3D) | Tm (° C.) |
|---|---|---|---|---|
| Example 1 | $WB_2$ | 3.7 | 4.7 | 2365 |
| Example 2 | $MoB_2$ | 4.6 | 5.2 | 2100 |
| Example 3 | $TaB_2$ | 5.6 | 5.8 | 3037 |
| Example 4 | $NbB_2$ | 5.8 | 5.9 | 3000 |
| Example 5 | $CrB_2$ | 5.5 | 6.6 | 2200 |
| Example 6 | CrB | 4.7 | 7.0 | 2100 |
| Example 7 | MoB | 5.8 | 7.5 | 2550 |

TABLE 3-continued

| Classification | Boride-based compound composition | ρλ (1D) | ρλ (3D) | Tm (° C.) |
|---|---|---|---|---|
| Example 8 | VB$_2$ | 6.2 | 7.2 | 2400 |
| Comparative Example 1 | Cu | 6.7 | 6.7 | 1085 |

Referring to Table 3, the results showed that the boride-based compounds of Examples 1 to 8 had reduced values of 1D figure of merit, compared to copper of Comparative Example 1.

As shown in Table 3, the boride-based compounds of Examples 1 to 8 have slightly higher values of 3D figure of merit, that is, 7.5 or less, than copper of Comparative Example 1, but high melting points thereof may allow the semiconductor device including a wiring formed therefrom to have improved reliability.

TABLE 4

| Classification | Boride-based compound composition | ρλ (1D) | Tm (° C.) |
|---|---|---|---|
| Example 9 | FeB | 7.0 | 1658 |
| Example 10 | Fe$_2$B | 6.2 | 1389 |
| Example 11 | Ni$_2$B | 6.2 | — |
| Example 12 | MnB$_2$ | 6.1 | — |
| Example 13 | AlB$_2$ | 6.7 | — |
| Example 14 | Mo$_2$B$_5$ | 6.9 | 1600 |
| Example 15 | W$_2$B$_5$ | 6.8 | 2100 |
| Example 16 | Cr$_2$AlB$_2$ | 6.1 | >1500 |
| Comparative Example 1 | Cu | 6.7 | 1085 |

Referring to Table 4, the boride-based compounds of Examples 10 to 12 and 16 had lower values of 1D figure of merit and higher melting points than copper of Comparative Example 1, and the semiconductor device including a wiring using the same may have improved reliability.

The boride-based compounds of Examples 9 and 13 to 15 had equal to or higher than values of 1D figure of merit and higher melting points than copper of Comparative Example 1, and the semiconductor device including a wiring using the same may have improved reliability.

The wiring material for a semiconductor device according to an aspect has a reduced pA or a reduced increment in the resistivity due to a reduction in the line width of the wiring, compared to the copper wiring, and the melting point thereof may be high, thereby maintaining excellent reliability even if a semiconductor device is downscaled.

Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A wiring material for a semiconductor device, the wiring material comprising:
a boride-based compound containing boron and at least one metal,
wherein the metal is tantalum (Ta), vanadium (V), titanium (Ti), zirconium (Zr), hafnium (Hf), uranium (U), manganese (Mn), dysprosium (Dy), erbium (Er), cerium (Ce), indium (In), gallium (Ga), or a combination thereof.

2. The wiring material of claim 1, wherein the metal is tantalum (Ta), vanadium (V), or a combination thereof.

3. The wiring material of claim 1, wherein an amount of boron in the boride-based compound ranges from 25 at. % to 88 at. %.

4. The wiring material of claim 1, wherein an amount of boron in the boride-based compound ranges from 50 at. % to 70 at. %.

5. The wiring material of claim 1, wherein the boride-based compound is a compound represented by Formula 1:

$$M_aB_b \quad \text{[Formula 1]}$$

wherein M in Formula 1 is Ta, V, or a combination thereof,
a is a number of 1 to 5, and
b is a number of 1 to 10.

6. A wiring material for a semiconductor device, the wiring material comprising:
a boride-based compound represented by Formula 2:

$$M1_aM2_cB_b \quad \text{[Formula 2]}$$

wherein in Formula 2,
M1 is W, Mo, Ta, Nb, Cr, Mn, V, Fe, Zr, Ti, Hf, or a combination thereof,
M2 is Al, Ga, In, or a combination thereof,
a is a number of 1 to 5,
b is a number of 1 to 5, and
c is a number of 1 to 10.

7. The wiring material of claim 6, wherein the boride-based compound is MoAlB, WAlB, Hf$_2$AlB, Hf$_2$GaB, Hf$_2$InB, Ti$_2$AlB, Ti$_2$GaB, Ti$_2$InB, Zr$_2$AlB, Zr$_2$GaB, Zr$_2$InB, Cr$_2$AlB$_2$, Mn$_2$AlB$_2$, Fe$_2$AlB$_2$, Cr$_4$AlB$_6$, or a combination thereof.

8. The wiring material of claim 1, wherein the boride-based compound has a 1D figure of merit of 6.7 or less.

9. The wiring material of claim 1, wherein the boride-based compound has a 1D figure of merit of 3 to 6.2.

10. The wiring material of claim 1, wherein the boride-based compound has a 3D figure of merit of 7.5 or less.

11. The wiring material of claim 1, wherein the boride-based compound has a 3D figure of merit of 4.5 to 7.5.

12. The wiring material of claim 6, wherein the boride-based compound has a melting point of 1300° C. or greater.

13. The wiring material of claim 1, wherein the boride-based compound has a melting point of 2000° C. or greater.

14. A wiring for a semiconductor-type device, the wiring comprising:
the wiring material of claim 1.

15. A semiconductor-type device comprising:
a wiring including the wiring material of claim 1.

16. The semiconductor-type device of claim 15, further comprising:
a semiconductor substrate; and
an interconnected structure on the semiconductor substrate, wherein
the interconnected structure includes a dielectric layer on the semiconductor substrate,
the dielectric layer has at least one trench formed therein,
the interconnected structure includes the wiring, and
the wiring is in the trench.

17. The semiconductor-type device of claim 16, wherein the interconnected structure further includes a barrier layer covering the wiring in the trench.

18. The semiconductor-type device of claim 16, wherein the trench of the interconnected structure extends through a thickness of the interconnected structure, and a depth of the trench is less than a thickness of the interconnected structure.

19. The semiconductor-type device of claim 16, wherein the interconnected structure further includes a liner layer covering the wiring inside the trench.

20. The semiconductor-type device of claim 19, wherein the liner layer exposes a top surface of the wiring.

21. The semiconductor-type device of claim 19, wherein the liner layer includes titanium nitride (TiN), titanium tungsten (TiW), tungsten nitride (WN), tantalum nitride (TaN), Ti, Ta, or a combination thereof.

22. The semiconductor-type device of claim 16, wherein the interconnected structure further comprises a barrier layer covering the wiring inside the trench, and the barrier layer has a single layered structure or a multi-layered structure, and the barrier layer exposes a top surface of the wiring.

23. The semiconductor-type device of claim 16, further comprising:
a logic device on the semiconductor substrate.

24. A wiring material for a semiconductor device, the wiring material comprising:
a boride-based compound,
wherein the boride-based compound is $TaB_2$, $TiB_2$, $ZrB_2$, $HfB_2$, $UB_2$, $MnB_2$, $DyB_2$, $ErB_2$, $Mn_3B_4$, $DyB_4$, $ErB_4$, $UB_4$, $Mo_2B_5$, $W_2B_5$, $LaB_6$, $CeB_6$, $DyB_6$, $ErB_6$, MoAlB, WAlB, $Hf_2AlB$, $Hf_2GaB$, $Hf_2InB$, $Ti_2AlB$, $Ti_2GaB$, $Ti_2InB$, $Zr_2AlB$, $Zr_2GaB$, $Zr_2InB$, $Cr_2AlB_2$, $Mn_2AlB_2$, $Fe_2AlB_2$, $Cr_4AlB_6$, or a combination thereof.

25. A semiconductor-type device comprising:
a substrate; and
a wiring including the wiring material of claim 24, wherein
the wiring is on the substrate.

26. The wiring material of claim 24, wherein the boride-based compound is $UB_2$, $MnB_2$, $DyB_2$, $ErB_2$, $Mn_3B_4$, $DyB_4$, $ErB_4$, $UB_4$, $Mo_2B_5$, $W_2B_5$, $LaB_6$, $CeB_6$, $DyB_6$, $ErB_6$, or a combination thereof.

27. A semiconductor-type device comprising:
a wiring including the wiring material of claim 6.

28. The wiring material of claim 1, wherein the boride-based compound is $TaB_2$, $TiB_2$, $ZrB_2$, $HfB_2$, $UB_2$, $MnB_2$, $DyB_2$, $ErB_2$, $Mn_3B_4$, $DyB_4$, $ErB_4$, $UB_4$, $DyB_6$, $ErB_6$, or a combination thereof.

* * * * *